United States Patent [19]
Maruyama et al.

[11] Patent Number: 5,047,978
[45] Date of Patent: Sep. 10, 1991

[54] BLOCH LINE MEMORY DEVICE

[75] Inventors: Youji Maruyama, Iruma; Tadashi Ikeda, Tsukui; Ryo Suzuki, Hachioji, all of Japan

[73] Assignee: Hitachi, Ltd., Tokyo, Japan

[21] Appl. No.: 362,646

[22] Filed: Jun. 7, 1989

[30] Foreign Application Priority Data

Jun. 17, 1988 [JP] Japan .................................. 63-148007

[51] Int. Cl.⁵ .............................................. G11C 19/08
[52] U.S. Cl. .......................................... 365/29; 365/87
[58] Field of Search ..................................... 365/29, 87

[56] References Cited

U.S. PATENT DOCUMENTS

| | | | |
|---|---|---|---|
| 4,731,752 | 3/1988 | Hidaka | 365/29 |
| 4,845,671 | 7/1989 | Maruyama et al. | 365/29 |
| 4,884,236 | 11/1989 | Maruyama et al. | 365/29 |

*Primary Examiner*—James W. Moffitt
*Attorney, Agent, or Firm*—Pennie & Edmonds

[57] ABSTRACT

A Bloch line read/write memory in which a Bloch line or lines near the end portion of a stripe domain are moved in a predetermined direction to turn the direction of a wall magnetization at the end portion to a right turn direction as viewed form the surface of a film on which a bubble chopping conductor is disposed, and thereby reduce erroneous reading errors and increase the chopping current margin.

14 Claims, 7 Drawing Sheets

BLOCH LINE MEMORY DEVICE

BACKGROUND OF THE INVENTION:

1. Field of the Invention

This invention relates to a solid magnetic memory and more particularly to a Bloch line memory device suitable for accomplishing a large capacity file memory.

A Bloch line memory is memory means that has drawn an increasing attention in the fields of information, communication, measurement, and the like, as a magnetic memory which will improve drastically the high density of magnetic bubble memory which is a non-volatile magnetic memory, too. The Bloch line memory device in accordance with the present invention can also be applied suitably for a data memory device of an electronic switchboard, a numeric control machine tool, a personal computer, POS, medical equipment, satellite, and so forth.

2. Description of the Prior Art

The Bloch line memory device uses a magnetic garnet as a memory medium in the same way as the magnetic bubble memory device, but its memory system is remarkably different from that of the latter. In the conventional magnetic bubble device, the existence and absence of bubble domains are made to correspond to "1" and "0" of information. In the Bloch line memory device, on the other hand, the existence and absence of a vertical Bloch line pair existing inside the wall around a stripe domain formed by extending the bubble domain is made to correspond to "1" and "0".

Hereinafter, the principle of the Bloch line memory will be explained.

FIG. 4 shows schematically the stripe domain in the magnetic film in the Bloch line memory device and the structure around its periphery. In the drawing, upward arrow 413 in the stripe domain 402 represents the direction of magnetization in the domain 402. Similarly, arrow 411 on the center line in the magnetic wall 401 represents the direction of magnetization located at the center of the wall 401 and arrow in a vertical direction to the center line of the magnetic wall represents a vertical Bloch line 403 (which will be hereinafter referred to merely as the "Bloch line"). The Bloch line memory stores the information by letting the portion 404a, where two Bloch lines exist as a pair, correspond to the information "1", for example, and the portion 404b, where they do not exist, to the information "0".

As described above, the Bloch line used as the information carrier is a very fine magnetization structure that exists in the magnetic wall 401 surrounding the stripe domain 402. The Bloch line exists stably in the magnetic wall 401 and can move freely inside it. Therefore, if a large number of stripe domains 402 are disposed in parallel at a predetermined position and Bloch lines 403 are allowed to exist in the magnetic wall thereof, they exhibit the behaviour just in the same way as the bubble domain that moves in the minor loop of a magnetic bubble memory device. For this reason, the Bloch line memory device can assume a shift register type memory device structure in the same way as the magnetic bubble memory device.

The presence of the Bloch line has long been known and experiments and their analysis have evidenced that the moving velocity of the domain where the Bloch line exists becomes smaller than that of the domain not having the Bloch line. Accordingly, in the magnetic bubble memory device requiring the movement of the domain, the bubble domain containing the Bloch line is referred to as a "hard bubble" and contrivances have been made so as to prevent its occurrence. In contrast, the Bloch line memory device utilizes positively the existence of this Bloch line.

The physical size of the Bloch line is about 1/10 of the width of the stripe domain where it exists and a large number of Bloch lines can be made to exist in one stripe domain. In the case of a magnetic garnet having a stripe domain width of 1 $\mu$m that has been developed at present for a magnetic bubble memory device, for example, about $5 \times 10^8$ Bloch lines can be made to exist per 1 cm$^2$. Therefore, if an information carrier is prepared by use of two Bloch lines as a pair, a memory device having a memory capacity of a 256 Mbit/cm$^2$ class can be fabricated.

As described above, the Bloch line can freely move around the stripe domain wall and can store the information (has a memory function). However, the write function and the read function of the information must be accomplished in order to constitute a memory device.

To attain the write function, a system has been known generally which causes a current to flow through a conductor disposed at the end of the stripe domain and applies a local field to the end portion of the stripe domain so as to invert the field by 180°. In other words, this can be understood by regarding that part of the area of the magnetization state 404b represented by "0" in FIG. 4 is inverted and attains the state 404a of the "1" area. At this time the boundary between the inverted area and the non-inverted area generates the state which has changed by 90° with respect to the magnetic wall because magnetization changes continuously. This is the Bloch line 403. Incidentally, since this state is generated always while two Bloch lines 403, 403' exist as a pair, binary information can be made to correspond to the existence and absence of a pair of Bloch lines.

The read operation of the information is conducted by transferring the existence and absence of the Bloch lines to the existence and absence of bubble domains. A transfer method from the Bloch line to the bubble domain is described by Konishi in IEEE Transactions on Magnetics, MAG-19, No. 5, 1983, pp. 1838-1843. In FIG. 4, if the Bloch line 403 exists in the wall 401 of the stripe domain 402, the direction of magnetization in the wall 401 inverts, with the Bloch line 403 being the boundary. Due to such a change of the magnetization structure, a change occurs in the easiness of chopping out the end portion of the magnetic domain between the case where one Bloch line 403 comes to move to the end portion of the stripe domain 402 and the case where no Bloch line 403 exists at the end portion. It is possible by utilizing this property to chop a bubble magnetic domain from the end portion of the stripe domain 402 only when one Bloch line 403 exists at the end portion of the stripe domain 402 by causing a predetermined current to flow through a chopping conductor disposed on and near the end portion of the stripe domain 402. The bubble domain thus chopped is transferred by the same method as the measure line of the bubble memory device and converted to an electric signal and by so doing, the existence of the Bloch line can be read out.

As described above, the Bloch line memory device can be accomplished by forming the functional portions of the write, store and read operations on the same device.

The write and read operations described above are disclosed, for example, in Japanese Patent Laid-Open No. 151374/1984.

FIG. 5 is a plan view of the Bloch line memory device. In this drawing the information storage portion is formed by aligning a large number of stripe domains 502. A transfer pattern 507 for stably transferring the Bloch line pairs and holding them are arranged, in such a manner as to cross orthogonally the stripe domains 502. The transfer pattern is formed by etching selectively etching the surface of a magnetic material or a magnetic garnet. A read functional portion 521 is disposed on the right side of the device while a write functional portion 520 is disposed on the left side.

The write functional portion 520 writes the Bloch line pair in the manner described above. If it is not desired to write (or to write "0" when the Bloch line pair is made to correspond to "1", for example) to a given stripe domain, a magnetic bubble 510 is caused to exist at a position on the extension of the end portion of that stripe domain. If the magnetic bubble exists; its magnetostatic repulsive force acts on the end portion of the stripe domain and the end portion of the stripe domain to which the write operation is not desired to be made can be separated from the write gate (in the rightward direction in the drawing) as shown in the drawing. In this manner the point of intersection between the conductor constituting the write functional portion 520 and the stripe domain can be released and the Bloch line pair is not written into the stripe domain even if the current pulse is applied to the conductor for the purpose of writing. (In other words, "0" is written in the embodiment described above). In order to provide the function described above, a magnetic bubble transfer path 523 and a magnetic bubble generator 512 are disposed in the write functional portion 520.

On the other hand, the read operation in the Bloch line memory device is conducted in the read functional portion 521. The existence of the magnetic bubble chopped out in the read operation is converted to the electric signal by the magnetic bubble detector 511 through the read transfer path 522. The existence and absence of this electric signal correspond to the existence and absence of the magnetic bubble or in other words, to whether or not the Bloch line exists at the end portion of a predetermined stripe domain. In this manner the read operation can be carried out.

In order to improve stability of the Bloch line pair, Japanese Patent Laid-Open No. 101092/1984 discloses a method which applies a bias magnetic field in an in-plane direction of a magnetic film and bringing the magnetization state of the stripe domain into an $S=0$ state. Here, symbol S is an S number which represents the number of revolutions of wall center magnetization when the domain turns once round the magnetic wall. If the Bloch line pair is kept stable by this method, three Bloch lines exist at the stripe domain head if the information "1" exists there and one Bloch line exists if "0" exists, when the information "1" is made to correspond to the "existence" of the Bloch line pair, for example.

According to this method, the Bloch line exists always at the stripe domain head irrespective of the information "1" and "0" and the information read operation cannot be made by the method described already alone.

Japanese Patent Laid-Open No. 248296/1986 discloses a method which solves this problem and accomplishes the read operation. This method comprises disposing two read preparation conductors at the end portion of a ring shaped domain, applying a transfer magnetic field and the causing a predetermined current pulse to flow through these conductors. According to this operation, one Bloch line can be made to exist at the stripe domain head only when the information "1" is transferred, and its existence and absence can be converted to those of the bubble and can be read out by the method of Konishi described already.

The method described above conducts the preprocessing of the read operation by utilizing the transfer magnetic field. In consequence, one Bloch line that exists at the stripe domain head in the case of the information "0" always moves in the transfer direction. Therefore, if the transfer direction is in the leftward direction towards the chopping conductor from the other end of the stripe domain as viewed from the film surface on which the chopping conductor is disposed, or in other words, if the transfer direction of the Bloch line is left turn as viewed from the film surface on which the chopping conductor is disposed, magnetic wall magnetization at the stripe domain head faces leftward when the read preparation operation is conducted. Accordingly, since the magnetic wall magnetization faces leftward, from the other end of the stripe domain towards the chopping conductor, or in other words, in the direction of the left turn described above, as viewed from the film surface on which the chopping conductor is disposed, the horizontal Bloch lines occur from the upper surface of the film equipped with the chopping conductor.

SUMMARY OF THE INVENTION

In accordance with one aspect of the present invention, there is provided a Bloch line memory comprising a magnetic film having its axis of easy magnetization in the direction of the normal of a film surface, a memory functional portion using a Bloch line pair occurring in the magnetic wall around a stripe domain formed in the magnetic film as an information carrier, a write functional portion for generating the Bloch line pair as the information carrier in the memory functional portion, a read functional portion having a conductor for chopping the stripe domain, disposed in the proximity of the end portion of the stripe domain and reading the information by converting the existence and absence of the Bloch line pair to the existence and absence of a bubble domain and magnetization/rotation means for turning the direction of magnetization of said magnetic wall at the end portion of the stripe domain when the Bloch line pair does not exist at the end portion to a right hand direction as viewed from the film surface on which the conductor is disposed.

The magnetization/rotation means described above can always maintain the direction of magnetization of the magnetic wall at the end portion of the stripe domain when the Bloch line pair does not exist, to a predetermined direction. In other words, the direction is always in the right turn direction as viewed from the film surface on which the conductor of the chop functional portion is disposed. In consequence, an erroneous operation or chopping of the bubble domain at the chop functional portion becomes extremely difficult to occur.

In accordance with a limited aspect of the present invention, there is provided a Bloch line memory wherein the magnetization/rotation means described above has a read preparation conductor for generating an in-plane field for separating the Bloch line pair at the end portion of the stripe domain. When a current is caused to flow through the read preparation conductor to generate the in-plane field in the direction for separating the Bloch line pair, if the Bloch line pair does not exist at the end portion of the stripe domain, or in other words, if one Bloch line exists and this Bloch line is moved from the end portion of the stripe domain due to the in-plane field described above, the direction of magnetization of the wall is the right turn direction as described above. This one Bloch line moves from the end portion of the stripe domain to its side portion as if it were being pushed by the magnetization in the right turn direction. The movement of the Bloch line occurs due to the existence of the field generated by the read preparation conductor around itself. The Bloch line existing at the end portion of the stripe domain receives a gyro-force in the direction of a right hand screw due to the field applied in the direction of the normal of the film surface and moves to the side portion of the stripe domain due to the in-plane field generated by the field described above. The moving direction is determined by the direction of the in-plane field generated by the conductor and by the direction of the field in the direction of the normal.

In order to move the Bloch line so that the direction of magnetization of the magnetic wall becomes the right hand direction, the chopping preparation conductor is preferably disposed so that at least its center line and the stripe domain superpose one upon another at the time of read-out of the information. In this manner the field in the direction of the normal to the film surface, which is generated at the conductor edge, acts on the single Bloch line existing at the stripe domain head. Since the Bloch line moves in the direction of the gyrotropic force applied by this field to the Bloch line, the direction of magnetization of the magnetic wall can be made to be the right hand direction. The Bloch line can be made to start moving in the predetermined direction by other means (as will be described elsewhere).

In accordance with another limited aspect of the present invention, there is provided a Bloch line memory device wherein the magnetization/rotation means described above is means for applying an in-plane field to the end portion of the stripe domain in the direction for separating the Bloch line pair after the movement of the Bloch line is started by rotating the bias in-plane field to be applied in the longitudinal direction of the stripe domain. The rotation of the in-plane field for starting the movement of the Bloch line and the application of the in-plane field for separating the Bloch line pair can be effected by a single in-plane field application/rotation means.

In accordance with still another limited aspect of the present invention, there is provided a Bloch line memory wherein the magnetization/rotation means described above includes means for applying a field in the direction of the normal of the film surface and a high coercive force in-plane magnetization film for holding the Bloch line existing at the end portion of the stripe domain at the side portion of the stripe domain.

In accordance with another aspect of the present invention, there is provided a Bloch line memory comprising information memory means for using Bloch lines in the magnetic wall around a stripe domain formed in a magnetic film as an information carrier, information write means for generating the Bloch lines in the information memory means and information read means for reading out the information stored in the information memory means, wherein the information read means includes means for directing the direction of magnetization of the magnetic wall at the end portion of the stripe domain to a predetermined direction at the time of chopping of the stripe domain by moving the Bloch line existing at the end portion of the stripe domain in a predetermined direction. Such a Bloch line memory includes a chopping conductor for chopping the stripe domain. If the predetermined direction described above is selected to be a right turn direction, chopping of the stripe domain becomes extremely difficult when chopping is not to be made and the operation margin of the information read-out can be improved remarkably.

In accordance with a limited aspect of the present invention, there is provided a Bloch line memory wherein the stripe domain described above is disposed in such a manner as to encompass a groove pattern disposed in the magnetic film. This groove pattern is preferably formed by digging 100% the magnetic film in the direction of depth, and can hold stably the stripe domain.

In accordance with another limited aspect of the present invention, there is provided a Bloch line memory wherein the means for directing the direction of magnetization of the magnetic wall at the end portion of the stripe domain to the predetermined direction includes means for generating a trigger field for moving the Bloch line existing at the end portion of the stripe domain in the predetermined direction and means for generating an in-plane field for holding the Bloch line thus moved at the side portion of the stripe domain. The means for generating the trigger field can insure the right turn direction of the direction of magnetization of the magnetic wall at the end portion of the stripe domain when chopping is not necessary. The means for generating the in-plane field can keep the right turn at the time of the chopping operation. A conductor disposed in the proximity of the stripe domain is available at the means for generating the in-plane field. It is possible by causing a current to flow through this conductor to generate the in-plane field having a desired direction (right turn direction of the direction of magnetization of the magnetic wall). It is advisable to dispose the chopping conductor for reading out the information and the means for generating the in-plane field in such a manner as to be superposed one upon another through an insulation film, for example, in the proximity of the end portion of the stripe domain. Preferably, a guide pattern for stabilizing the position of the end portion of the stripe domain is disposed near the end portion in order to keep stably the position of the end portion at the time of chopping.

One advantage of the present invention is that the operation margin in the information read operation of the Bloch line memory can be improved remarkably. More definitely, the range of a domain chopping current at the time of read-out for converting the existence of the Bloch line to the existence of the bubble can be increased by as great as five times when compared with the prior art technique.

Another advantage of the present invention is that since the direction of magnetization of the magnetic wall, when no Bloch line pair exists at the end portion of the stripe domain, can be made to direct to the right hand direction towards the chopping conductor from the other end of the stripe domain as viewed from the film surface on which the stripe domain chopping conductor is disposed, chopping of the stripe domain, when no Bloch line pair exists (corresponding to the information "0", for example), becomes more difficult so that its distinction from the case where the Bloch line pair exists (corresponding to the information "1", for example) becomes extremely easy.

Still further advantages of the present invention will become apparent to those skilled in the art upon reading and understanding the following detailed description of the preferred embodiments in conjunction with the accompanying drawings.

BRIEF DESCRIPTION OF THE DRAWINGS

The invention may take form in various parts and arrangements of parts. The drawings are only for purpose of illustrating the preferred embodiments and are not to be construed as limiting the invention.

DESCRIPTION OF THE PREFERRED EMBODIMENTS

Figure 6:
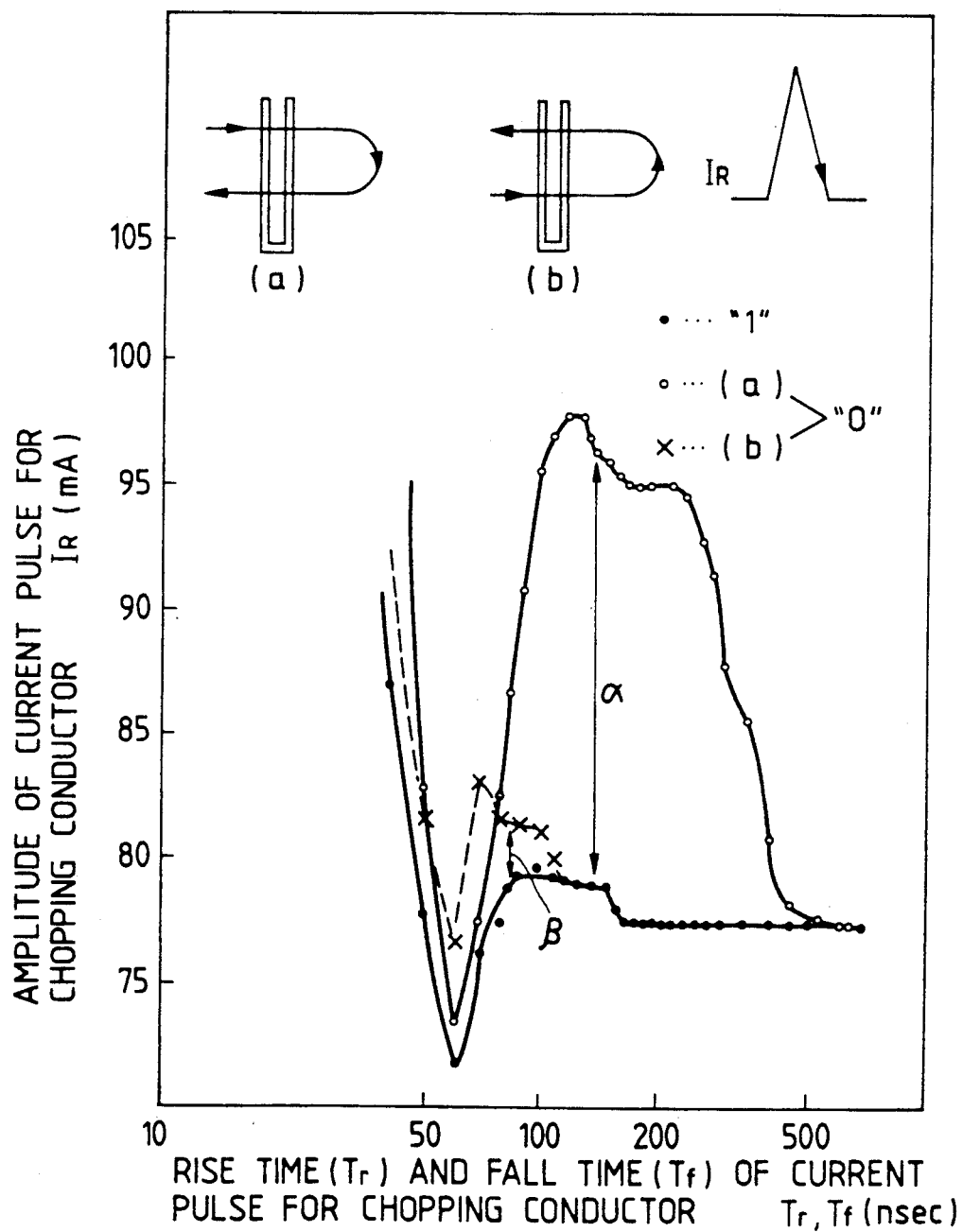
FIG. 6 is a characteristic diagram showing the relation between the magnetization state and cutting condition of the stripe domain by use of the rise and fall of a current pulse as parameters.

FIG. 6 is a diagram showing an example of the chopping characteristics and the relation between the rise time and fall time of a chopping current pulse and the amplitude of the current pulse is shown in the diagram. In this diagram, black circle (●) represents the case where one Bloch line exists at the end portion of a stripe domain (this case corresponds to the information "1"), white circle ○ (a) represents the case where the magnetic wall magnetization faces rightward when no Bloch line exists at the end of the stripe domain (corresponding to the information ("0") and symbol X (b) represents the case where the magnetic wall magnetization faces leftward.

As can be understood from the diagram, in the case (a) where the magnetization faces rightward, the horizontal Bloch line that may result in an erroneous operation occurs from the lower surface of the film where the magnetic field is weak so that the erroneous operation does not occur easily even by a strong current pulse and the stripe domains cannot separate easily. It can be distinguished from the stripe domain corresponding to the information "1" with a width of a current range $\alpha$. On the other hand, in the case (b) where the domain faces leftward, the horizontal Bloch line occurs from the upper surface of the film where the magnetic field is strong so that the erroneous operation is likely to occur and it can be distinguished from the stripe domain corresponding to the information "1" only within a current range $\beta$ which is by far smaller than the value $\alpha$ described above.

Accordingly, when the wall magnetization faces leftward as viewed from the film surface on which the chopping conductor is disposed in accordance with the transfer direction, the erroenous operation is likely to occur at the time of chopping and satisfactory read characteristics cannot be obtained.

In the description of FIG. 6, the case where no Bloch line pair exists at the end portion of the stripe domain corresponds to the information "0" and the case where the Bloch line pair exists corresponds to the information "1", but the explanation holds also true of the case where the correspondence relation is reverse.

As described above, the chopping current value is different depending on the direction of the wall magnetization when the Bloch line pair does not exist at the end portion of the stripe domain (the state of the information "0" in the explanation given above) and particularly when the direction of the wall magnetization faces rightward, the stripe domain becomes more difficult for chopping than the case where the Bloch line pair exists (the state of the information "1" in the explanation given above). Accordingly, if the direction of the wall magnetization when the BloCh line pair does not exist at the end portion of the stripe domain is always directed rightward, irrespective of the transfer direction as is made in the present invention, the read operation range (the chopping current range where the existence of the Bloch lines can be converted to the existence of the bubbles) can be enlarged.

Figure 3:
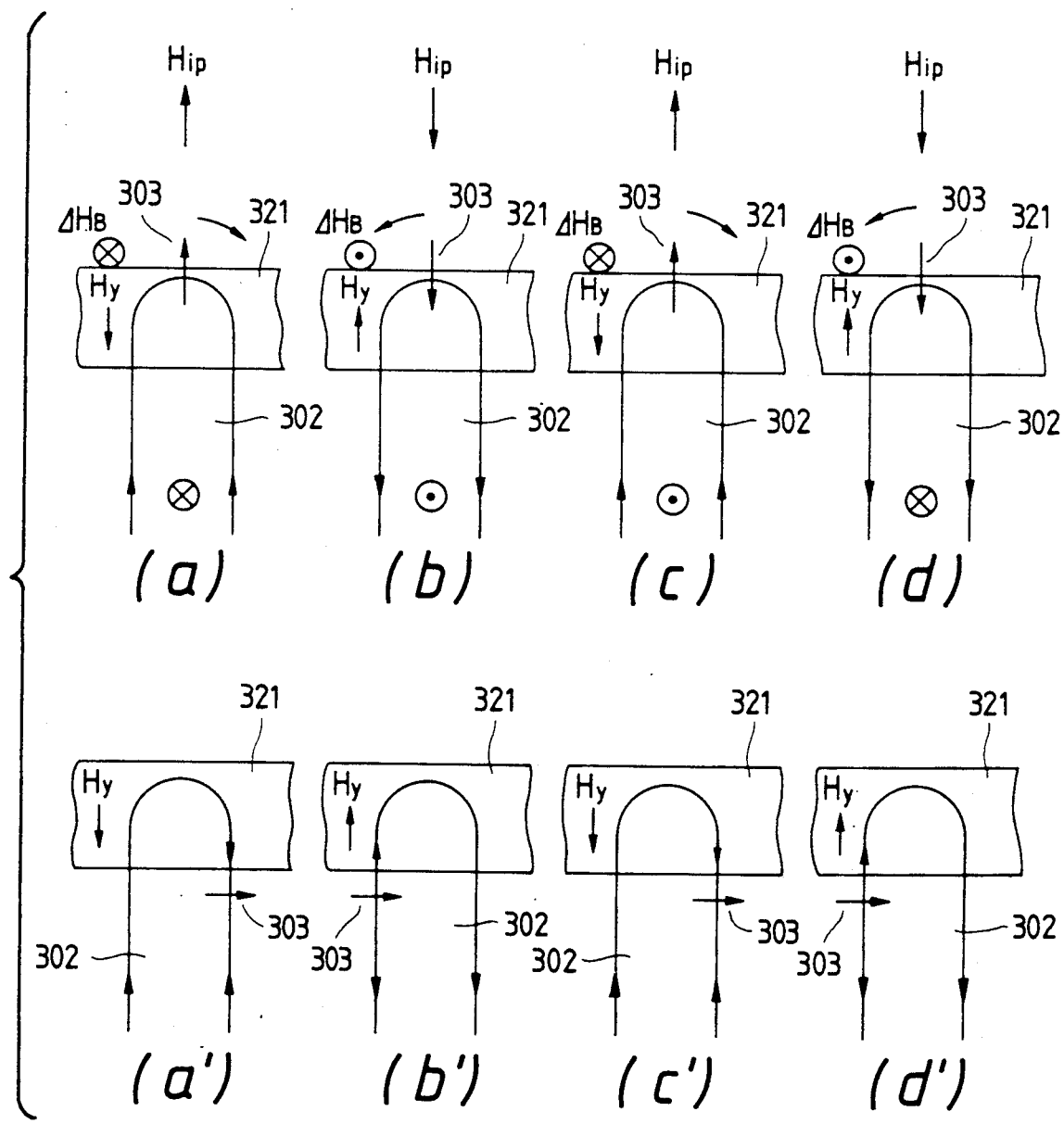
FIG. 3(A) to (D) and (A') to (D') is an explanatory view useful for explaining one embodiment of the present invention.
Figure 4:
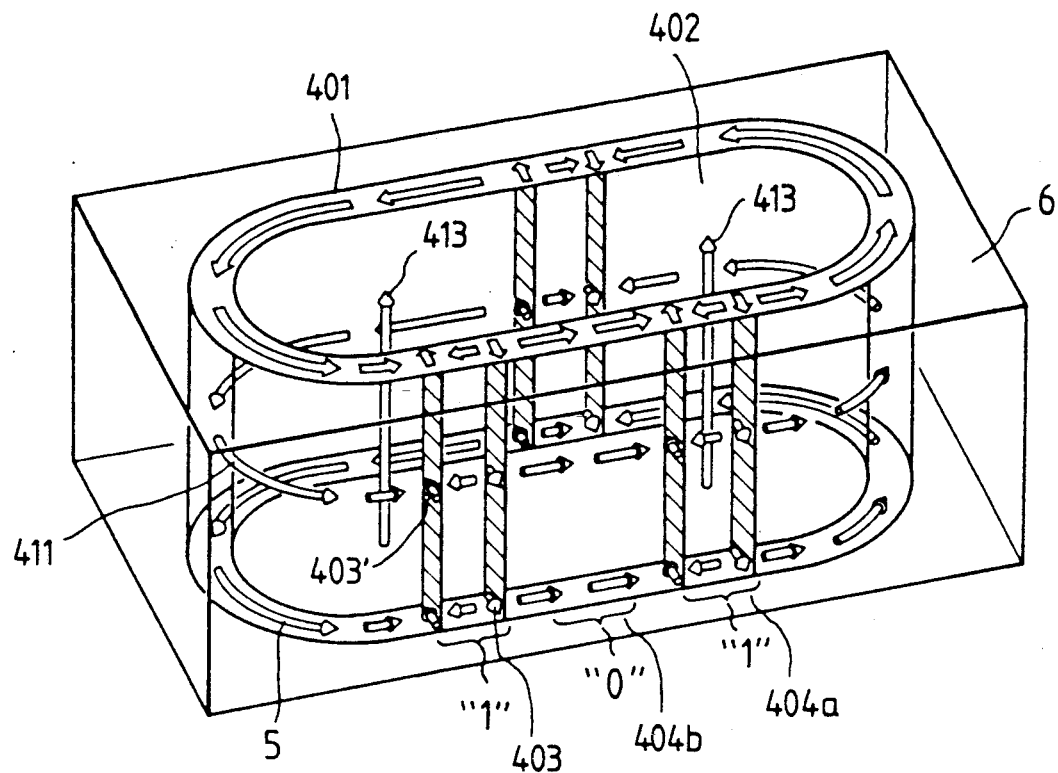
FIG. 4 is a conceptual view of stripe domains and Bloch lines existing in a magnetic garnet film.

The operation of the present invention will be explained in detail with reference to the embodiment thereof shown in FIG. 3. In the description to follow, the case where the Bloch line pair does not exist at the end portion of the stripe domain corresponds to the information "0" and the case where it exists corresponds to the information "1". FIGS. 3(a) to 3(d) show all the combinations of the bias in-plane field Hip for stably holding the Bloch line pair and the direction of magnetization of the stripe domain.

In FIGS. 3(a) to 3(d), if the information "0" exists at the end portion of the stripe domain 302, one Bloch line 303 exists at the end portion before the read preparation operation Under this state, if a read preparation conductor 321 is arranged in such a manner as to be deeply superposed on the stripe domain 302 (or in other words, so that at least the center of the conductor is superposed with the stripe domain 302) and an Hy field having an opposite direction to Hip is generated by applying a current to the read preparation conductor 321, a vertical field $\Delta H_B$ acts on each Bloch line 303 existing at the end portion of the stripe domain in the direction shown in the drawing. Due to this field $\Delta H_B$, the Bloch line 303 receives the gyro-force in the direction of the right hand screw and moves to the positions indicated by (a')~(d') by the Hy field. Due to the movement of this Bloch line 303, the wall magnetization at the stripe domain head faces rightward in all the examples as shown in the drawing. This read preparation conductor constitutes the magnetization/rotation means in the present invention.

The Bloch line can be moved from the stripe domain head by the vertical field occurring from this read preparation conductor 321 and by the in-plane field without utilizing the transfer field, and the direction of the wall magnetization in the case of the information "0" under all the conditions can be turned to the right hand direction by superposing deeply the read preparation conductor with the stripe domain head. As described with reference to FIG. 6, therefore, the stripe domain cannot be chopped easily and can be distinguished from the stripe domain head of the information "1" in a wide chopping current range. Accordingly, an operation margin increases and improved read characteristics can be obtained.

Though the explanation of the operation given above deals with the case where the read preparation conductor is used as the magnetization rotation means, it is also possible to have the direction of the wall magnetization rightward in the case of the information "0" under all conditions in the same way as above and to thereby obtain improved good read characteristics, as will become more obvious from the following embodiments.

[Embodiment]

Figure 1:
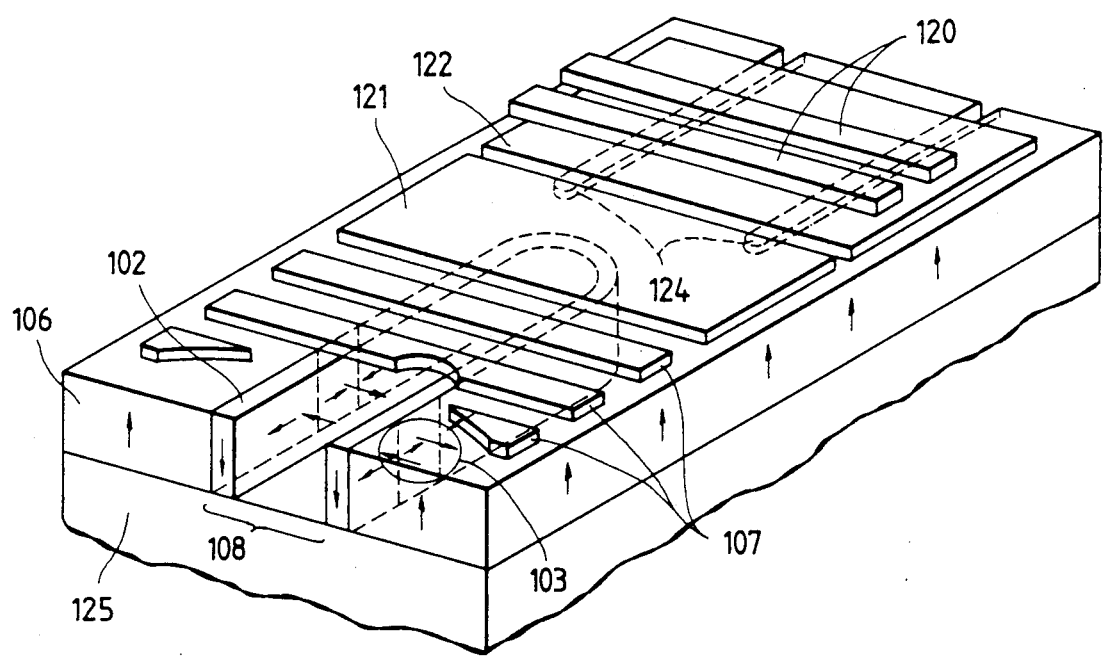
FIG. 1 is a partially selection perspective view of a Bloch line memory device in accordance with one embodiment of the present invention.

FIG. 1 is a partial sectional perspective view of one embodiment of the present invention and shows the structure of an end portion of one stripe domain 102 forming a memory portion and its peripheral portion.

Figure 5:
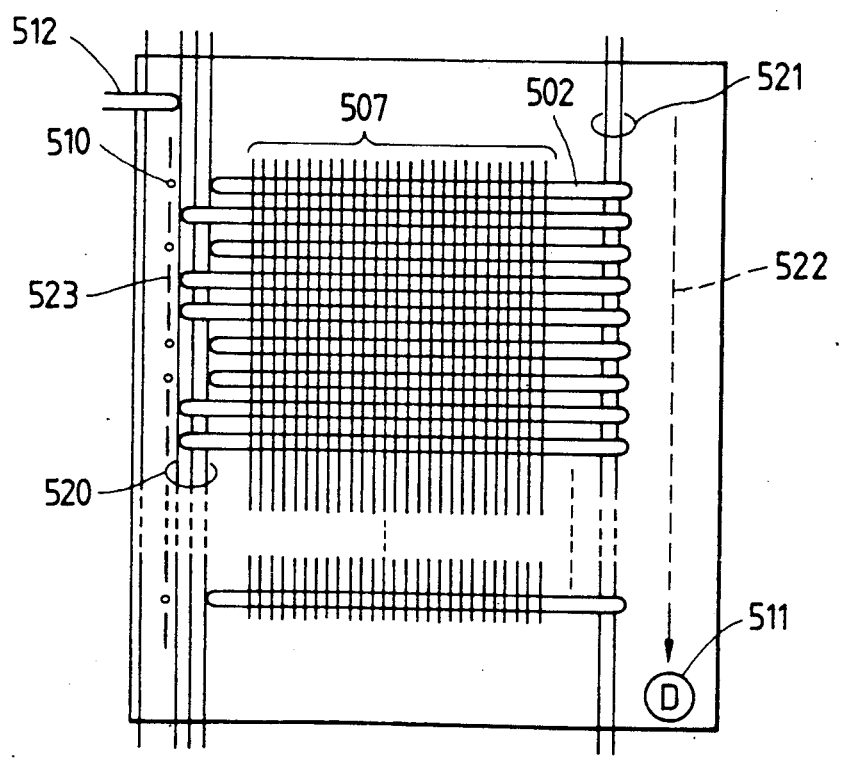
FIG. 5 is a conceptual plan view of the Bloch line memory device.

In FIG. 1, a non-magnetic substrate 125 consists, for example, of a 0.4 mm-thick gadolinium-gallium-garnet plate and a magnetic garnet film 106 (e.g. a 5 μm-thick CaGe type magnetic garnet thin film) is formed on the former. A stripe domain 102 containing therein a Bloch line pair 103 as the information carrier exists in such a manner as to encompass a groove pattern 108 disposed in the magnetic garnet film 106. This groove pattern 108 has the function of fixing the stripe domain 102 and is disposed in such a manner that a large number of stripe domains 102 can be disposed in parallel (see FIG. 5, for example). The groove pattern 108 is formed by digging 100% the magnetic garnet film 106. A transfer path pattern 107 (which is also referred to as a "bit pattern") is composed of a high coercive force in-plane magnetization film and is disposed on the stripe domain 102 in such a manner as to cross it at right angles. A read preparation conductor 121 consists, for example, of an about 0.5 μm-thick Au film. Preferably, this conductor 121 is formed at a position where at least its center superposes with the head of the stripe domain 102. A conductor 122 for generating an in-plane field is formed outside the read preparation conductor 121 and consists of the Au film in the same way as the latter. A chopping conductor 120 is formed on the in-plane field generation conductor 122 through an insulation film, not shown, and consists of the Au film in the same way as the conductors 121 and 122 described above. A guide pattern 124 is formed by digging the magnetic garnet film 106 by about 0.5 to 0.1 μm the magnetic garnet film 106 below the in-plane field generation conductor 122.

Next, FIGS. 2A to 2E are conceptual plan views of the device shown in FIG. 1 and represent the operation of the read portion of the Bloch line memory device.

In FIGS. 2A to 2E, the stripe domain 202 exists in the magnetic garnet film 106 shown in FIG. 1 and is disposed and fixed by the groove pattern 208. A guide pattern 224 as a guide at the time of extension of the stripe domain 202 is disposed between a zigzag conductor 223 for transferring the bubble occurring after readout (not shown in FIG. 1) and the groove pattern 208. The read preparation conductor 221 is disposed at the end portion of the stripe domain 202 and the in-plane field generation conductor 222 and the chopping conductor 220 are disposed between 221 and 223. Incidentally, the Bloch line pair 203 (the information carrier) is transferred in the magnetic wall around the stripe domain. 202 with the portion immediately below the transfer path pattern 207 and with the end portion of the stripe domain 202 being its stability position Hereinafter, the operation of the device shown in FIG. 1 will be described with reference to FIG. 2. Incidentally, in each of the drawings 2A to 2E, (a) represents the information "0" state and (b) does the information "1" state.

Figure 2A:
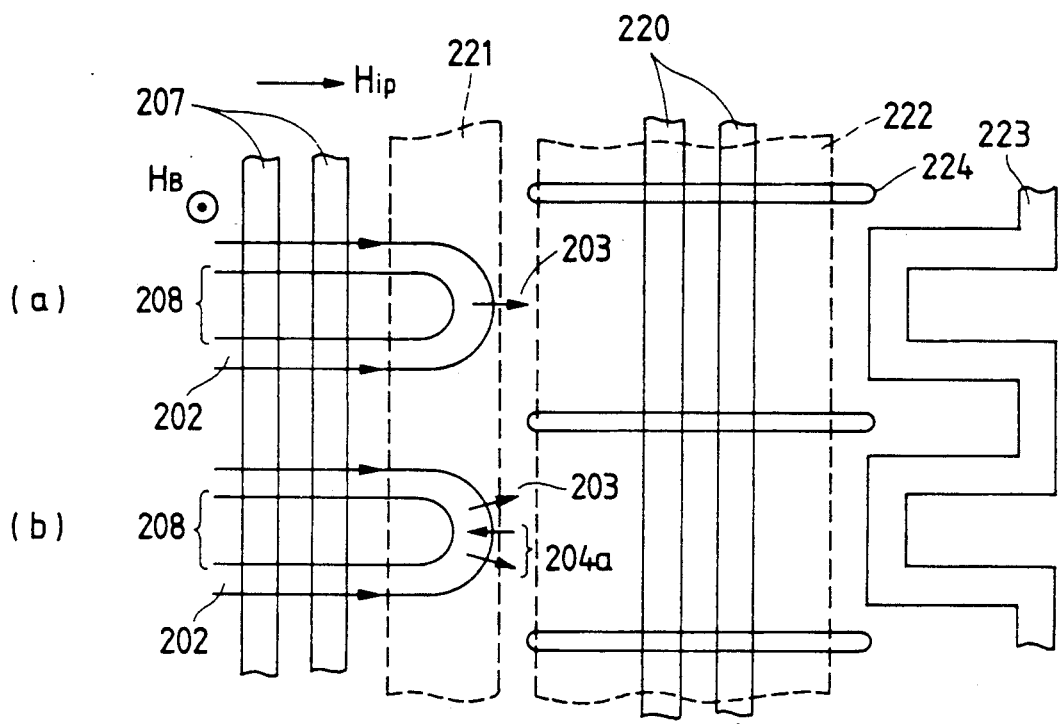
FIGS. 2(A) to 2(E) are a conceptual plan view of a read portion of a Bloch line memory device of the present invention.

First of all, in FIG. 2A, (a) represents the state where the information "0" is transferred to the end portion of the stripe domain 202 and (b) does the state where the information "1" is transferred to the end portion of the stripe domain 202.

Figure 2B:
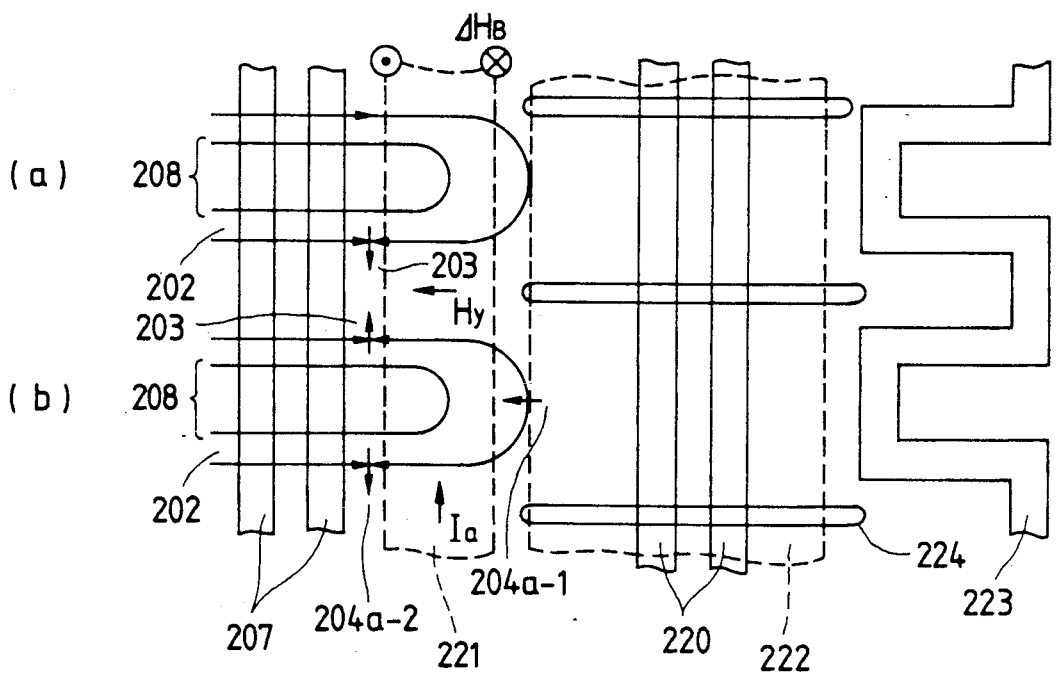

Next, as shown in FIG. 2B, when a current Ia is caused to flow through the read preparation conductor 221, the Bloch line 203 existing at the tip moves and does not exist at the end portion of the stripe domain 202 any more due to the resulting in-plane field Hy and the vertical field $\Delta H_B$ in the case (a) of the information "0". In the case of the information "1" in the state (b) of FIG. 2A, on the other hand, the Bloch line 203 existing at the tip and the Bloch line pair 204a as the information carrier receive the gyrotropic force so that they turn slightly rightwards at the beginning of the supply of the current Ia but since the Hy field acts in such a direction as to separate the Block line pair 204a, one 204a-2 of the Bloch line pair 204a is held at the side of the stripe domain but the other 204a-1 is pulled back to the end portion of the stripe domain 202 as shown in (b). Accordingly, the Bloch line 203 cannot but move to the upper magnetic wall an the separation of the three lines is accomplished. Due to this separation, the wall magnetization at the end portion of the stripe domain 202 faces the Hy direction and the three line separation state can be maintained.

Figure 2C:
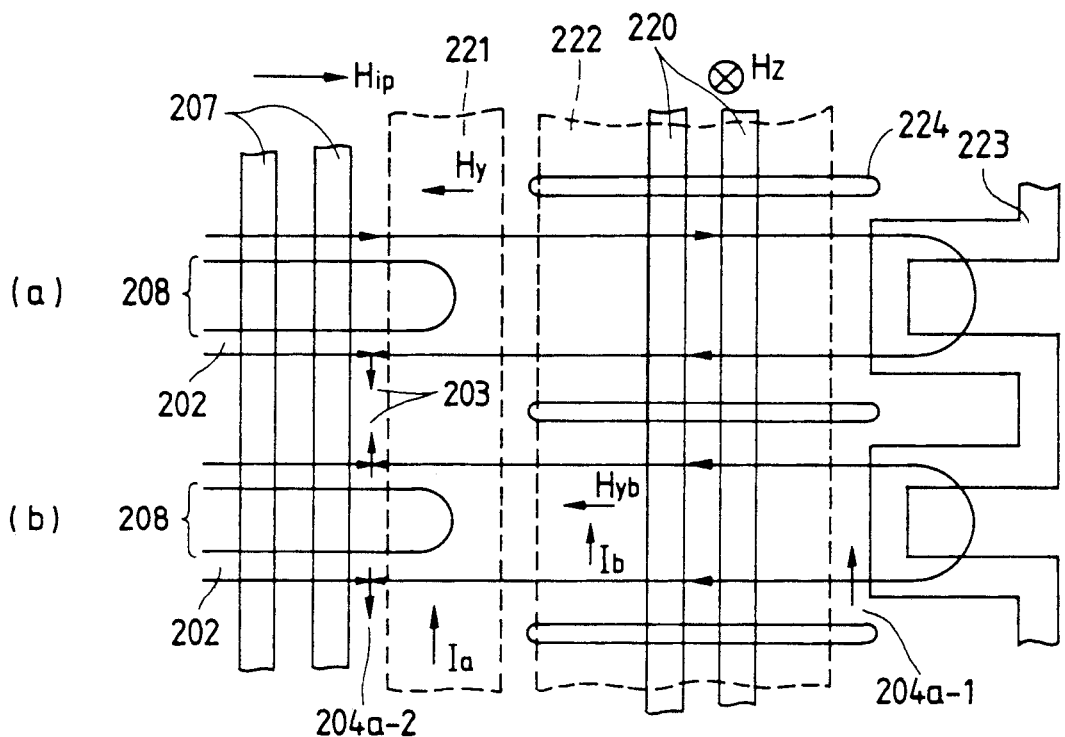

Next, when a current Ib is caused to flow through the in-plane field generation conductor 222 and a bias field Hz is applied thereto so as to extend the stripe domain 202 towards the zigzag conductor 223 as shown in FIG. 2C, the Bloch line 204a-1 moves to the tip beyond the chopping conductor 220 due to the in-plane field Hyb generated by the current Ib. If this state is kept, one Bloch line 204a-1 can be made to exist at the head of the stripe domain 202 only in the case of the information "1". If the in-plane field Hyb does not exist, the Bloch line 204a-1 cannot get over the chopping conductor 220 because Hip is applied.

Figure 2D:
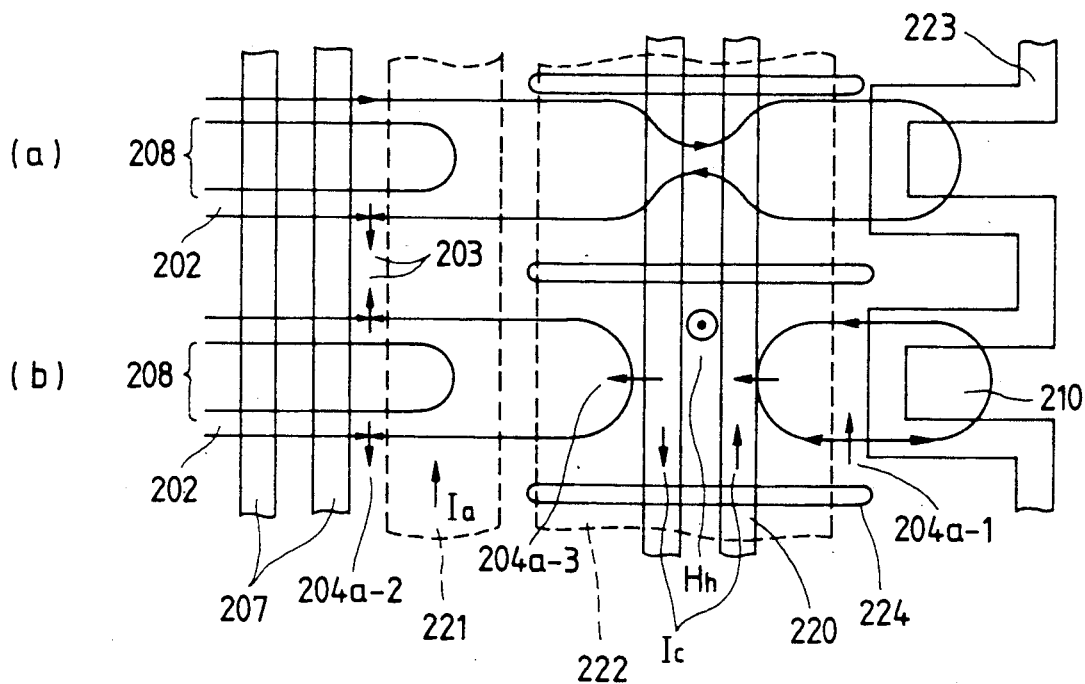

Next, as shown in FIG. 2D, a bubble 210 can be chopped out only in the case (b) where the Bloch line exists at the head of the stripe domain 202 by causing a current Ic to flow through the chopping conductor 220. At this time a new Bloch line 204a-3, occurs at the head of the stripe domain 202 and the information can be preserved.

Figure 2E:
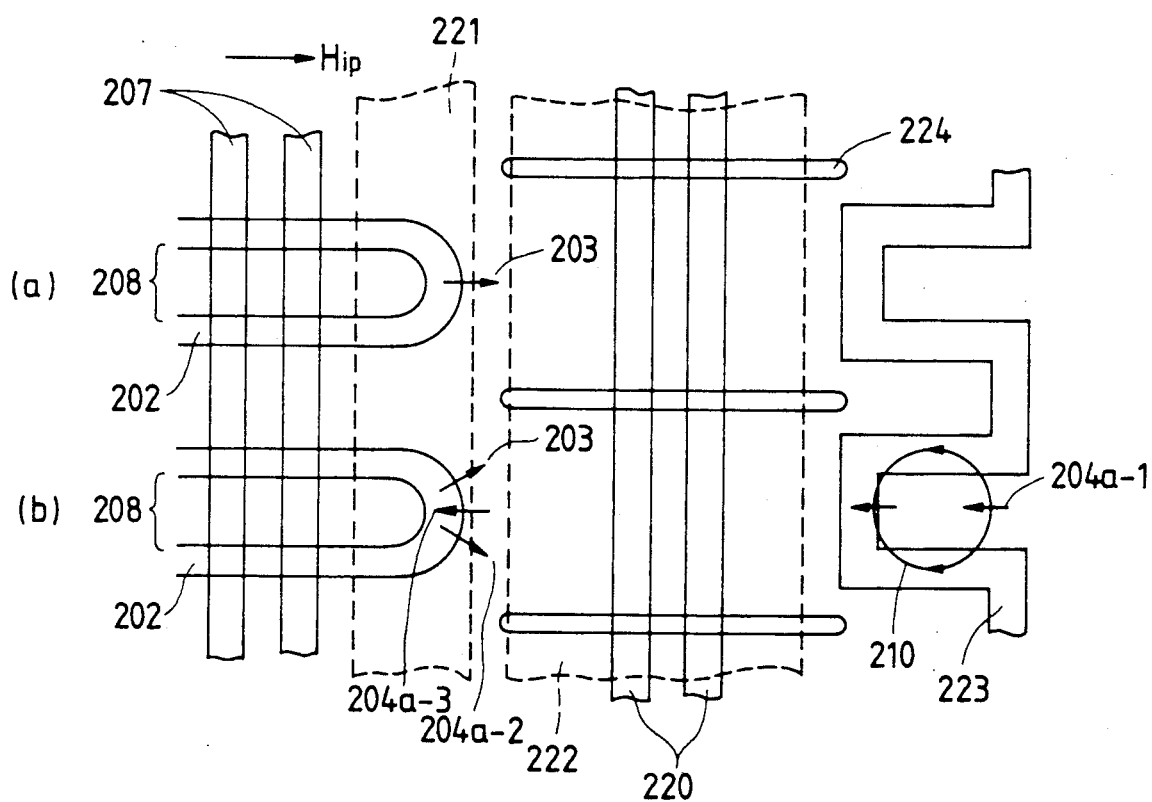

The bubble 210 chopped out remains on the zigzag conductor 223 as the bias field Hz is cut off, as shown in FIG. 2E. Thereafter the bubble 210 is transferred along the zigzag conductor 223 and converted to an electric signal by a bubble detector not shown. In this manner, the read-out operation of the information can be made.

The read preparation conductor 221 and in-plane field generation conductor 222 described above are important in order to generate primarily the in-plane field. Therefore, their width is as great as possible and according to the experiments conducted by the present inventors, a width of about 100 μm is found excellent in consideration of the width of the stripe domain 202.

The existence of the in-plane field generation conductor 222 is important for the Bloch line 204a-1 to get over the chopping conductor 220 and this operation cannot be attained by the read preparation conductor 221. In other words, in order to accomplish the movement described above, the width of the read preparation conductor 221 must be increased so that an unnecessary vertical field component increases when a predetermined Hyb field is generated and the stored information gets destroyed. However, the read preparation conductor 221 and the in-plane field generation conductor can be used commonly by extending gradually the stripe domain while the read information is allowed to exist at the end portion of the stripe domain 202 and then separating the Bloch line pair by the in-plane field generation conductor 222. In this case, too, the relation of position between the position of the end portion of the stripe domain before the separation of the Bloch line pair and the position of the conductor 22 must be made equal to that between the former and the position of the conductor 221. If this method is employed, the present invention can be practiced without the necessity of deliberately disposing the conductor at the position where it is superposed with the end portion of the memory portion.

According to the operation described above, one Bloch line can be made to exist at the end portion of the stripe domain 202 only when the information "1" exists at the end portion and the direction of the wall magnetization can be made to face rightward in the case of the information "0". Accordingly, the information "1" can be converted stably to the "existence" of the bubble depending on the chopping method.

The state described above can be established under all the conditions even in the Hip direction or in the bias field Hz direction other than the embodiment given above as has already been explained with reference to FIG. 3. Therefore, the stable read characteristics can be obtained.

The inventors of the present invention have confirmed that the invention can be practiced in the Bloch line memories using Ga system garnets as the medium other than the CaGe type garnet.

To accomplish the present invention, it is important that the Bloch line corresponding to the information "0" starts moving in the predetermine direction. In the case of the present embodiment, the vertical field generated from the read preparation conductor is used as the trigger for the start of movement but the present invention can be practiced, too, by slightly rotating the bias in-plane field to be applied to the longitudinal direction of the stripe domain from the predetermined direction. In other words, the energy-wise stable position of the Bloch line at the end portion of the stripe domain is attained when it faces the direction of the bias in-plane direction. Therefore, when the bias in-plane field rotates slightly, the Bloch line starts moving in the rotating direction. For this reason the present invention can be accomplished in the same way as the embodiment given above by selecting the rotating direction so that the wall magnetization faces rightward (or each Bloch line is moved in the direction which is determined by the bias vertical field condition and shown in FIGS. 3(a')-3(d')). More definitely, the bias in-plane field is rotated within the range of 10° to 45° with respect to the longitudinal direction of the stripe domain and this rotation is used as the trigger for the start of movement of the Bloch line. Thereafter, the in-plane field is applied to the end portion of the stripe domain in such a manner as to separate the Bloch line pair. In this manner the wall magnetization can be rotated rightward when the information is "0".

When three Bloch lines corresponding to the information "1" exist at the end portion of the stripe domain, they start moving similarly when the bias in-plane field rotates. However, it is only two Bloch lines positioned in the moving direction that keep this movement. The one remaining Bloch line is positioned near the end portion of the stripe domain due to the longitudinal component of the stripe domain in the bias in-plane field. Therefore, these Bloch lines can be separated in the same way as in the embodiment described above by applying the in-plane field in the direction which separates the Bloch line pair. In this manner the present invention can be practiced without any problem.

It could be understood easily by those skilled in the art that the present invention can be practiced by disposing the high coercive force in-plane magnetization film in place of the in-place field generation conductor used in the present invention at the position of the latter and by generating a predetermined in-plane field. The inventors have confirmed this fact through experiments.

The Bloch line can be moved in a predetermined direction, and the present invention can thereby be practiced, by disposing the high coercive force in-plane magnetization film on or beneath, or in place of, the read preparation conductor at the position of the latter and by applying the vertical field generated from the end portion of the conductor or an equivalent vertical field Hz from outside in addition to the in-plane field Hy generated by the high coercive force in-plane magnetization film.

It is necessary to determine the moving direction of the Bloch line from the directions of the bias in-plane field Hip and bias vertical field $H_B$ set in advance for practicing the embodiment of the present invention in order to rotate rightward the wall magnetization (in the case of the information "0"). There are two methods as the methods of generating the trigger for the start of this movement. The first generates the vertical field and the second rotates the in-plane field. The present invention can be practiced without any problem by use of either one, or both, of these methods.

High coercive force can be kept inside the plane by use of a magnetization film containing at least the elements selected from the group consisting of Co-Pt, Co-Ni, Co-Zr, Co-Ni-Zr, Co-Cr, Sm-Co and Nd-Fe-B as the high coercive force in-plane magnetization film described above.

Although the present invention has been described with reference to the embodiment wherein the case where the Bloch line pair does not exist at the end portion of the stripe domain corresponds to the information "0" and the case where it does corresponds to the information "1", the invention can also be applicable to the reverse cases.

Although the present invention has thus been described with reference to the preferred embodiments thereof, various modifications and alterations will obviously occur to those of ordinary skill in the art upon reading and understanding the present specification. It is therefore intended that the invention be construed as including all such modifications and alterations in so far as they come with the scope of the appended claims or the equivalent thereof.

Having thus described the preferred embodiments, the invention is now claimed to be as follows.

What is claimed is:

1. A Bloch line memory comprising:
a magnetic film having its axis of easy magnetization in the direction of the normal of a film surface;

a memory functional portion using as an information carrier a Bloch line pair occurring in the magnetic wall around a stripe domain formed in said magnetization film, the stripe domain having an end portion thereof;

a write functional portion for generating said Bloch line pair as the information carrier in said memory functional portion;

a read functional portion having a conductor for chopping said stripe domain, disposed near the end portion of said stripe domain and converting the existence and absence of a bubble domain so as to read out the information; and magnetization/rotation means for converting the magnetization direction of said magnetic wall at the end portion having no Bloch line pair to a right turn direction as viewed from the film surface on which said conductor is disposed.

2. The Bloch line memory as set forth in claim 1, wherein said magnetization/rotation means generates an in-plane field in a direction for separating said Bloch line pair where the information "1" exists at the end portion of said stripe domain.

3. The Bloch line memory as set forth in claim 2, wherein said magnetization/rotation means is a conductor and generates said in-plane field when a current is caused to flow therethrough.

4. The Bloch line memory as set forth in claim 3, wherein said conductor is caused to function under the state where at least its center line and said stripe domain are superposed one upon another.

5. The Bloch line memory as set forth in claim 1, wherein said magnetization/rotation means includes means for starting the movement of said Bloch line by rotating a bias in-plane field applied in the longitudinal direction of said stripe domain and means for applying said in-plane field in a direction separating said Bloch line pair to the end portion of said stripe domain.

6. The Bloch line memory as set forth in claim 5, wherein said means for starting the movement of sad Bloch line and said means for applying said in-place field in the direction separating said Bloch line pair are common field application means.

7. The Bloch line memory as set forth in claim 1, wherein said magnetization/rotation means includes means for applying a field in the direction of the normal of the film surface of said magnetic film and a high coercive force in-plane magnetization film for moving said Bloch line existing at the end portion of said stripe domain to the side portion of said stripe domain.

8. The Bloch line memory as set forth in claim 1, which further comprises means for guiding the end portion of said stripe domain.

9. A bloch line memory comprising:

information means using Bloch lines formed in the magnetic wall around a stripe domain having an end portion thereof formed in a magnetic film as an information carrier;

information write means for generating said Bloch lines in said information memory means; and information read means for reading out the information of said information memory means;

said information read means including means for turning the direction of the wall magnetization at the end portion of said stripe domain when chopping of said stripe domain to a predetermined direction by moving said Bloch line existing at the end portion of said stripe domain in a predetermined direction.

10. The Bloch line memory as set forth in claim 9, which further includes a conductor for chopping said stripe domain.

11. The Bloch line memory as set forth in claim 9, wherein said stripe domain is disposed in such a manner as to encompass groove patterns disposed in said magnetic film.

12. The Bloch line memory as set forth in claim 10, wherein said means for turning the direction of the wall magnetization at the end portion of said stripe domain to a predetermined direction includes means for generating a trigger field for moving said Bloch line existing at the end portion of said stripe domain in a predetermined direction and means for generating an in-plane field for holding said Bloch line thus moved at the side portion of said stripe domain.

13. The Bloch line memory as set forth in claim 12, wherein said means for generating said in-plane field is a conductor disposed near the end portion of said stripe domain.

14. The Bloch line memory as set forth in claim 12, wherein said conductor for chopping said stripe domain and said means for generating said in-plane field are disposed in such a manner as to be superposed near the end portion of said stripe domain through an insulation film.

* * * * *